Jan. 20, 1953 R. C. CHEEK 2,626,354

OSCILLATOR CIRCUIT

Filed June 23, 1949

WITNESSES:

E. A. McClaskey.

Wm. T. Wofford

INVENTOR

Robert C. Cheek.

BY

Hyman Diamond

ATTORNEY

Patented Jan. 20, 1953 2,626,354

UNITED STATES PATENT OFFICE 2,626,354

OSCILLATOR CIRCUIT

Robert C. Cheek, Irwin, Pa., assignor to Westinghouse Electric Corporation, East Pittsburgh, Pa., a corporation of Pennsylvania Application June 23, 1949, Serial No. 100,808

5 Claims. (Cl. 250—36)

My invention relates to electronic circuits, and particularly to oscillators of the capacitance tuned type.

The plate output voltage of a conventional capacitance tuned oscillator of the Colpitts type decreases as the frequency of the oscillator is decreased. Such a characteristic is undesirable in most oscillator applications.

For example, in a conventional capacitance tuned superheterodyne radio receiver, the output of all the tuned stages decreases as the receiver is tuned toward the low end of the frequency band. This results in a decrease in gain which is emphasized where the mixer includes a local oscillator of the capacitance tuned type whose output decreases as it is tuned toward the low end of its frequency range. In this application, it would be desirable to have a local oscillator whose output would increase toward the low end of the frequency band in such a manner as to compensate for the decreased gain in the tuned stages of the receiver, thus giving the receiver a substantially constant gain over its entire tuning range.

In other oscillator applications, such as in signal generators, it is desirable that the oscillator output be substantially constant over its frequency range.

It is, accordingly, an object of my invention to provide an oscillator which will have a substantially constant output over a desired frequency range.

A further object of my invention is to provide a capacitance tuned oscillator having a controllable voltage output characteristic.

It is another object of my invention to provide an oscillator having a controlled output characteristic.

It is also an object of my invention to provide a capacitance tuned oscillator whose output voltage decreases as the frequency of oscillation increases, according to a predetermined pattern.

My invention, together with additional objects and advantages, will best be understood from the following description, when read in connection with the accompanying drawing, in which.

Figure 1:
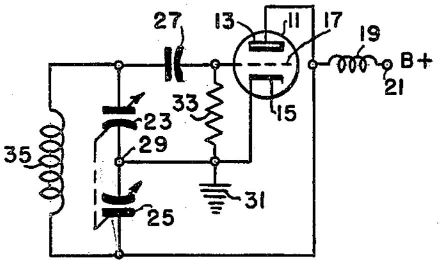
Fig. 1 is a schematic circuit diagram of a conventional capacitor tuned oscillator.

The conventional type capacitance tuned oscillator shown in Fig. 1 includes an oscillator tube 11 having an anode 13, cathode 15 and a grid 17. The anode 13 is connected through an R. F. choke 19 to the positive terminal 21 of a plate voltage supply. A pair of ganged variable capacitors 23, 25 are connected from the anode 13 through a blocking condenser 27 to the grid 17 of the oscillator tube 11. The common junction 29 of the ganged capacitors is connected to the cathode 15 of the oscillator tube 11 and to ground 31. The conventional grid leak resistor 33 is connected between the common junction 29 of the blocking condenser 27 and the grid 17 of the oscillator tube 11 and ground 31. A tank inductance coil 35 is connected in parallel with the ganged capacitors 23, 25.

It is the usual practice in tuning oscillators of the conventional type just described, to fix the value of the ganged capacitors at some definite ratio and to vary the tank circuit inductance, or to maintain the inductance at a fixed value and make the ganged capacitors the variables. Because of the difficulty of providing suitable variable inductances, the latter arrangement is usually preferred. In this case, as the oscillator is tuned toward the low end of its frequency band, the output voltage appearing between plate and cathode will decrease, resulting in a characteristic such as that shown by curve (*a*) of Fig. 3.

My invention arises from the realization that the drooping oscillator output voltage characteristic is a result of a decrease in the tuned tank-circuit impedance as the oscillator is tuned toward the low end of its frequency band. This realization led me to an investigation of the feedback characteristics as related to the tank circuit arrangement of a conventional capacitor tuned oscillator of the Colpitts type.

My invention can best be explained with the aid of a mathematical analysis of some of the characteristics of a capacitance tuned Colpitts oscillator. In particular, it is desirable to investigate the relationship of variations in tank circuit capacitance to the amount of feed-back voltage obtained for a particular oscillator frequency.

Due to the complicated nature of the functions involved as a result of operation in the saturation regions of the oscillator tube characteristics, this analysis is qualitative and does not treat all possible phenomena in the case, but will serve to illustrate my invention.

Figure 4:
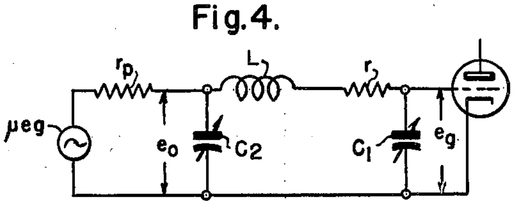
Fig. 4 is an equivalent circuit of Fig. 1.

With reference to Fig. 4, the grid-cathode and plate-cathode capacitors of the oscillator shown in Fig. 1 are $C_1$ and $C_2$ respectively. The oscillator tank circuit inductance and its resistance are represented by L and $r$, respectively. The plate resistance of the oscillator tube is $r_p$. The grid-cathode voltage is $e_g$. The voltage across $C_2$, represented by $e_o$, is the plate output voltage. The voltage across $C_2$ and $r_p$, represented by $-\mu e_g$, is the internally generated output voltage of the oscillator tube.

If the impedance looking into the oscillator tank circuit across $C_2$ is called $Z_o$, then since:

$$\frac{-\mu e_g}{e_o}=\frac{r_p+Z_o}{Z_o}$$

the plate output voltage may be expressed:

(1) $$e_o=\frac{-\mu e_g Z_o}{r_p+Z_o}$$

The total resonant impedance of the tank circuit is $Q\omega L$.

In a tapped parallel resonant circuit such as the tank circuit of Fig. 4:

(2)

$$\frac{\text{Impedance offered to input }(Z_o)}{\text{Total resonant impedance }(Q\omega L)}=$$

$$\left(\frac{C_1}{C_1+C_2}\right)^2 \omega C_1=\frac{1}{Xc_1}\text{ and }\omega C_2=\frac{1}{Xc_2}$$

Substituting in (2)

$$\frac{Z_o}{QwL}=\left(\frac{\frac{1}{Xc_1}}{\frac{1}{Xc_1}+\frac{1}{Xc_2}}\right)^2=\left(\frac{Xc_2}{Xc_1+Xc_2}\right)^2$$

(3) $$Z_o=\left(\frac{Xc_2}{Xc_1+Xc_2}\right)^2 QwL$$

But:

$$Q=\frac{wL}{r}\text{ and }wL=Xc_1+Xc_2$$

Then substituting in (3)

(4) $$Z_o=\frac{Xc_2^2}{r}$$

Substituting (4) in (1)

(5) $$e_o=\frac{-\mu e_g Xc_2^2}{r\left(r_p+\frac{Xc_2^2}{r}\right)}$$

Substituting $$\frac{1}{wc_2}$$

for $Xc_2$ in (5)

(6) $$e_o=\frac{-\mu e_g}{w^2C_2^2rr_p+1}$$

Since the expression $w^2C_2^2rr_p$ is very large compared to 1 in (6), the 1 may be neglected and (6) may be written:

(7) $$e_o=\frac{-\mu e_g}{w^2C_2^2rr_p}$$

But $$w=\frac{1}{\sqrt{L\frac{C_1C_2}{C_1+C_2}}}$$

Substituting for $w$ in (7):

(8) $$e_o=\frac{-\mu e_g LC_1}{(C_1+C_2)C_2rr_p}$$

It is apparent from examination of Equation 8 that the value of $e_o$ will increase more rapidly if $C_1$ alone is increased than if $C_1$ and $C_2$ are simultaneously increased while the ratio of $C_1$ to $C_2$ is kept constant. Although variation of $C_1$ affects the value of $\mu e_g$, this effect is minimized by the fact that the grid of the oscillator tube is operated in the region of saturation.

Figure 3:
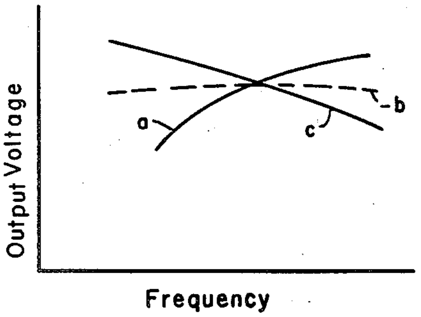
Fig. 3 is a group of curves showing, non-quantitatively, several output characteristics of capacitance tuned oscillators to aid in the description of my invention.

This means that if $C_1$ alone is increased, as the oscillator is tuned toward the low end of its frequency range, the oscillator output voltage will tend to increase, resulting in a characteristic similar to curve (c) of Fig. 3. On the other hand, if both $C_1$ and $C_2$ are varied to tune the oscillator toward the low frequency end of its range, the output voltage will tend to decrease, giving a characteristic curve similar to curve (a) of Fig. 3.

Thus I have found that by tuning only the grid-cathode capacitor in an oscillator such as the one shown in Fig. 1, I can obtain an output voltage characteristic which rises toward the low end of the oscillator frequency range to compensate in such applications as local oscillator in a superheterodyne receiver, for the drooping characteristics of succeeding stages.

Figure 5:
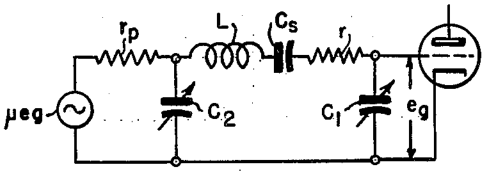
Fig. 5 is an equivalent circuit of Fig. 1 modified.

I have further found that by placing an additional capacitance of the proper value in series with the tank coil of the oscillator, I can accurately control the slope of the output voltage characteristic. This aspect of my invention may be analyzed mathematically with reference to Fig. 5, which is an equivalent circuit identical to Fig. 4 except that a capacitor $C_s$ has been added in series with the tank inductance coil.

The plate output voltage may be expressed:

(9) $$e_o=\frac{-\mu e_g Z_o}{r_p+Z_o}$$

as in (8).

(10) $$Z_o=\frac{QwLXc_2^2}{(Xc_s+Xc_1+Xc_2)^2}$$

But $$Q=\frac{wL}{r}$$

and $$wL=Xc_s+Xc_1+Xc_2$$

Then substituting in (10):

(11) $$Z_o=\frac{Xc_2^2}{r}$$

as in (4).

Substituting (11) in (9).

(12) $$e_o=\frac{-\mu e_g}{w_2C_2^2rr_p}$$

as in (7).

But $$w=\frac{1}{\sqrt{\frac{L\frac{C_1C_2C_s}{C_1+C_2}}{\frac{C_1C_2}{C_1+C_2}+C_s}}}$$

(13) $$=\frac{1}{\sqrt{\frac{LC_1C_2C_s}{C_1C_2+C_1C_s+C_2C_s}}}$$

Substituting (13) in (12):

(14) $$e_o=\frac{-\mu e_g LC_1C_s}{(C_1C_2+C_1C_s+C_2C_s)C_2rr_p}$$

Since

(15) $$e_g=\frac{e_oC_2}{C_1}$$

Substituting (14) in (15) and for simplification, taking $\mu e_g=1$ $$e_g=-\frac{LC_s}{(C_1C_2+C_1C_s+C_2C_s)rr_p} \tag{16}$$

or:

$$e_g=-\frac{L}{\left(C_1+C_2+\frac{C_1C_2}{C_s}\right)rr_p} \tag{17}$$

Without the series capacitor $C_s$, Equation 17 would become:

$$e_g=-\frac{L}{(C_1+C_2)rr_p} \tag{18}$$

By comparison of Equations 17 and 18, it will be seen that with $C_s$ in the circuit, as $C_1$ is increased to tune the oscillator toward the low end of the frequency range, the value of $e_g$ will decrease more rapidly than if $C_s$ were not in the circuit. This means that by using $C_s$ it is possible to obtain an oscillator output voltage characteristic which is substantially flat, such as the one shown by curve (b) of Fig. 3. By choosing the proper value of $C_s$ it is possible to obtain substantially any desired oscillator voltage output characteristic.

Figure 2:
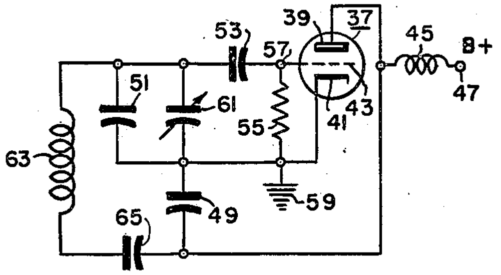
Fig. 2 is a schematic circuit diagram of a preferred embodiment of my invention.

In accordance with a preferred embodiment of my invention, I provide an oscillator circuit as shown in Fig. 2. This oscillator circuit includes an oscillator tube 37 having an anode 39, a cathode 41 and a grid 43. A radio frequency choke 45 is connected from the anode 39 of the oscillator tube 37 to the positive terminal 47 of an anode voltage source. A first 49 and second 51 fixed capacitor are connected in series from the anode of the oscillator tube through a blocking condenser 53 to the grid 43 of the oscillator tube 37. The conventional grid leak resistor 55 is connected between the junction 57 of the blocking condenser 53 and the grid 43 of the oscillator tube 37 and ground 59. A variable capacitor 61 is connected in parallel with the fixed cathode grid capacitor 51. A tank inductance coil 63 in series with a third fixed capacitor 65 is connected in parallel with said first 49 and second 51 fixed capacitor.

This oscillator is tuned by varying only the grid cathode capacitance. While it is within the broad scope of my invention to have only one grid cathode capacitance, that being a variable capacitance, the use of a plurality of paralleled grid-cathode capacitances, properly proportioned, permits the desired frequency band to be spread over the entire range of the tuning control.

With a circuit such as the one just described, the value of the third fixed capacitor 65 which is connected in series with the tank inductance coil may be chosen so as to adjust the output versus frequency characteristic of the oscillator as required, so that with the proportion of the cathode-anode 49 and the cathode-grid 51, 61 capacitors such that the desired frequency range is obtained, the desired output characteristic is obtained. Increasing the value of the third fixed capacitor 65, with corresponding decrease in the value of the cathode-anode capacitor 49 will provide a more dropping characteristic with a given decrease of the variable cathode grid capacitor 61 and vice versa. The third fixed capacitor 65 has the additional desirable effect of decoupling the oscillator tank circuit to some extent from the oscillator tube 37, making the frequency of the oscillator less sensitive to variations in the inter-electrode capacitances in the tube and resultant changes in frequency caused by supply voltage variations.

For use as the local oscillator in a superheterodyne receiver where it is desirable to have the oscillator output increase toward the low end of the oscillator frequency band to compensate for a corresponding decrease in gain of the various receiver stages, I have used the following circuit constants to obtain an oscillator output voltage characteristic similar to that shown by curve (c) of Fig. 3:

| | |
|---|---|
| Grid leak resistance **55** | 100,000 ohms. |
| Grid blocking capacitor **53**. | 100 micro-microfarads. |
| Fixed cathode grid capacitance **51**. | 75 micro-microfarads. |
| Variable grid cathode capacitance **61**. | 5 to 28.5 micro-microfarads. |
| Fixed anode-cathode capacitance **49**. | 47 micro-microfarads. |
| Tank inductance | 2.5 micro-henries (approx.). |
| Series capacitance **65** | 57 micro-microfarads. |

By the proper selection of circuit constants, it is possible to obtain an oscillator output voltage characteristic which rises at a desired slope toward the low end of the oscillator frequency band for application such as the one just illustrated, or to obtain a substantially constant characteristic for applications, such as in a signal generator, where that is desirable. In addition to making possible the selection of any desired oscillator output voltage characteristic, my invention has the advantage of replacing the variable cathode-anode capacitor 25 of Fig. 1 of the prior art capacitance tuned Colpitts oscillator circuits with a fixed capacitor 49 of Fig. 2. This results in a reduction of cost of the oscillator as well as a saving in space.

While I have shown and described a specific embodiment of my invention, I am fully aware that many modifications thereof are possible. My invention, therefore, is not to be restricted except in so far as is necessitated by the prior art and by the spirit of the appended claims.

I claim as my invention:

1. An oscillator comprising an electric discharge device having at least an anode, a cathode, and a grid, terminals for connection to a source of anode potential, an inductance connected between said anode and grid, a capacitance connected in shunt with said anode and cathode, and a plurality of paralleled capacitances, at least one of which is variable, connected between said grid and cathode.

2. An oscillator comprising an electric discharge device having at least an anode, a cathode, and a grid, terminals for connection to a source of anode potential, an inductance and capacitance connected between said anode and grid, a capacitance connected in shunt with said anode and cathode, and a plurality of paralleled capacitances, at least one of which is variable, connected between said grid and cathode.

3. An oscillator comprising an electric discharge device having an anode, a cathode, and a grid, terminals for connection to a source of anode potential, a tunable circuit comprising an inductive reactance in series with a first capacitive reactance and connected in shunt with a second capacitive reactance, said second capacitive reactance being connected in shunt with said anode and cathode, connections from the junction of said inductive reactance and first capacitive reactance to said grid, said first capacitive reactance including paralleled capacitance at least part of which is variable.

4. An oscillator comprising an electric discharge device having an anode, a cathode and a control electrode, terminals for connection to a source of anode potential, a series circuit including a tuning inductance, a first capacitor, a second capacitor, and a capacitive reactance at least part of which is variable, means for connecting the junction of said inductance and said capacitive reactance to said control element, means for connecting the junction of said first and second capacitors to said anode, and means for connecting the junction of said capacitive reactance and said second capacitor to said cathode.

5. An oscillator comprising an electric discharge device having an anode, a cathode and a control electrode, terminals for connection to a source of anode potential, a series circuit including a tuning inductance, a first capacitor, a second capacitor, and a variable capacitor, means for connecting the junction of said inductance and said variable capacitor to said control element, means for connecting the junction of said first and second capacitors to said anode, and means for connecting the junction of said variable capacitor and said second capacitor to said cathode.

ROBERT C. CHEEK.

REFERENCES CITED

The following references are of record in the file of this patent:

UNITED STATES PATENTS

| Number | Name | Date |
|---|---|---|
| 1,452,339 | Heising | Apr. 17 ,1923 |
| 1,838,084 | Drake | Dec. 29, 1931 |
| 2,278,066 | Domack et al. | Mar. 31, 1942 |